US 6,333,664 B1

(12) United States Patent
Umberger

(10) Patent No.: US 6,333,664 B1
(45) Date of Patent: Dec. 25, 2001

(54) LOW OPERATING POWER, HIGH VOLTAGE RINGING SWITCH CIRCUIT

(75) Inventor: Dean M. Umberger, Stouchsburg, PA (US)

(73) Assignee: Agere Systems Guardian Corp., Allentown, PA (US)

( * ) Notice: Subject to any disclaimer, the term of this patent is extended or adjusted under 35 U.S.C. 154(b) by 0 days.

(21) Appl. No.: 09/643,253

(22) Filed: Aug. 22, 2000

(51) Int. Cl.[7] .................................................. H03K 17/04
(52) U.S. Cl. ......................... 327/376; 327/428; 327/453; 327/381; 327/475
(58) Field of Search ..................................... 327/428, 438, 327/453, 460, 461, 445, 465, 376, 381, 462, 469, 470, 473, 475, 439, 374.377; 326/21

(56) References Cited

U.S. PATENT DOCUMENTS

| | | | |
|---|---|---|---|
| 4,231,054 | * 10/1980 | Ruetsch et al. | 327/470 |
| 4,492,975 | * 1/1985 | Yamada | 327/460 |
| 4,578,595 | * 3/1986 | Tihanyi et al. | 327/427 |
| 4,779,126 | * 10/1988 | Herman | 257/113 |
| 5,027,020 | * 6/1991 | Guajardo | 327/428 |
| 5,463,307 | * 10/1995 | Rosenberg | 323/300 |
| 5,463,344 | * 10/1995 | Temple | 327/428 |
| 5,631,494 | * 5/1997 | Sakurai et al. | 257/572 |
| 5,861,639 | * 1/1999 | Bernier | 257/157 |

* cited by examiner

Primary Examiner—Terry D. Cunningham
Assistant Examiner—Long Nguyen

(57) ABSTRACT

An integrated ringing access switch circuit for telecommunications switching applications that provides improved dV/dt sensitivity at low operating power by using a pilot controlled rectifier, such as an SCR, that conducts at low ringing signal currents and operates to steer a bias current for causing a relatively larger controlled rectifier in parallel therewith to become conductive during higher load current operation. Also included is circuitry for preventing inadvertent turn-on of the SCRs in response to transient signals.

18 Claims, 2 Drawing Sheets

LOW OPERATING POWER, HIGH VOLTAGE RINGING SWITCH CIRCUIT

BACKGROUND OF THE INVENTION

1. Field of the Invention

Figure 1:
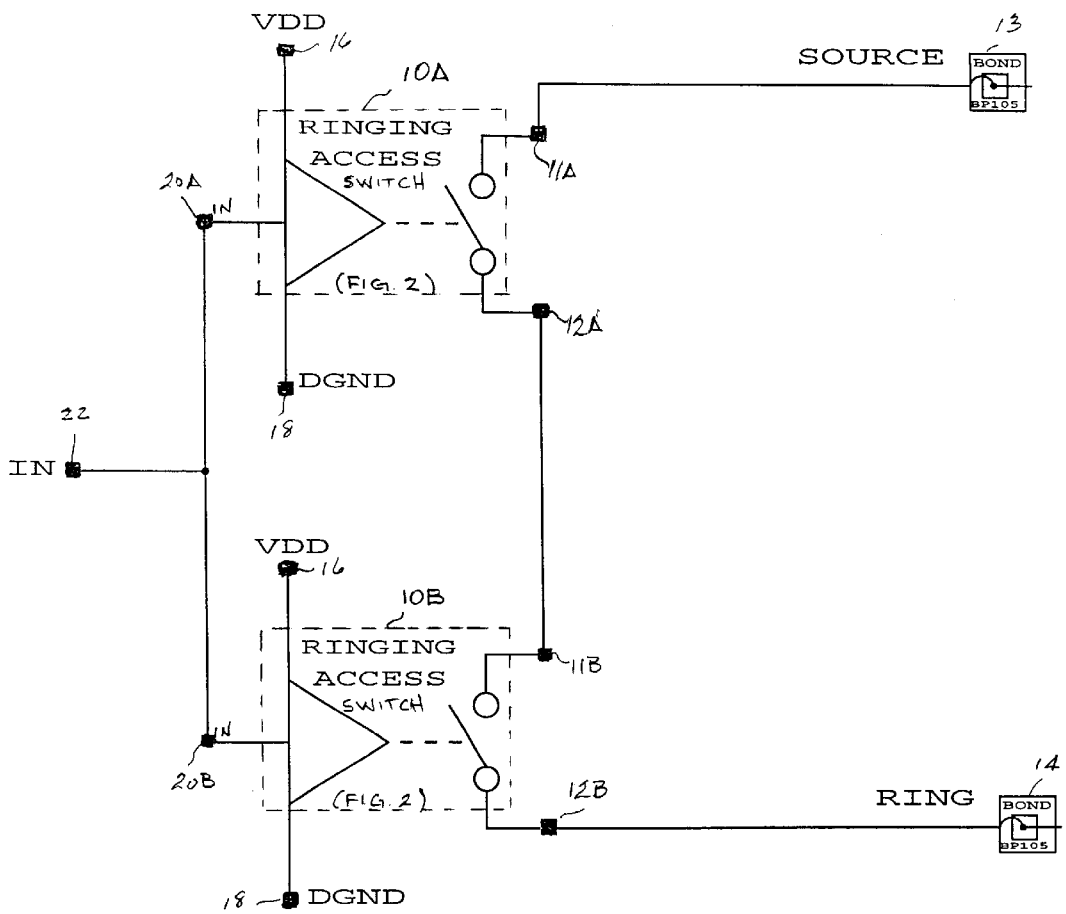

This invention relates generally to telecommunications switching apparatus, and more particularly to a high voltage, high current, low operating power ringing access relay for telecommunications switching applications in remote environments.

2. Description of Related Art

A solid state switch connected between a ringing signal generator and a ring device in telecommunications systems has a known minimum breakdown voltage requirement determined by the maximum clamp voltage of the external protection device connected from the ring device to ground plus the maximum ring voltage having an opposite polarity. In certain applications, the minimum breakdown voltage of the ringing access switch is approximately 500 volts. However, when utilizing components having a 320 volt breakdown capability, the high voltage junctions must necessarily be placed in series to meet this requirement.

In addition to the breakdown requirement in the OFF state, the ringing access switch must survive fault conditions in the ON state without degradation of performance. Surge currents through this switch resulting from, for example a lightening strike, can reach over 2 amps depending upon the amplitude of the lightening pulse and the impedance in the ringing circuit path.

To minimize current flow through a ringing access switch, the switch design can include current limiting circuitry to permit a maximum level of conduction that does not interfere with peak ringing signal currents, approximately 150 mA. However, because of the breakdown voltage requirement, current limiting of two series bidirectional switches is required. This presents a very complicated and costly design problem, for each series switch must share the same voltage and power.

Previous designs consisting of ringing access switches implemented in integrated circuits have exhibited inherent limitation of inadvertent turn-on in the presence of fast voltage transients at the switch terminals. This dV/dt sensitivity can cause the switch to become latched in the wrong state, requiring a reset of the device. Designs that improve dV/dt sensitivity to eliminate the inadvertent turn-on of the switch requires relatively higher bias current and operating power. However, these designs cannot be used in applications where low operating power is of primary importance.

SUMMARY

Accordingly, it is an object of the present invention to provide an improvement in telecommunications switching apparatus.

It is another object of the invention to provide an improvement in solid state ringing access switches used to telecommunications switching apparatus.

It is another object of the invention to provide an improvement in ringing access switches for telecommunications apparatus using semiconductor devices that can withstand 2 amp surges and can be connected in series to support 500 volt isolation pole-to-pole.

These and other objects are provided by a ringing access switch circuit for an integrated circuit that provides improved dV/dt sensitivity at low operating power by using a pilot controlled rectifier such as an SCR that conducts at low ringing signal currents and operates to steer a bias current for causing a relatively larger controlled rectifier in parallel therewith to become conductive during higher load current operation.

In one aspect of the invention, the ringing access switch circuit is comprised of: a solid state switch circuit, comprising: at least one pair of parallel semiconductor devices connected together such that the conductive state of one of the semiconductor devices of said pair controls the conductive state of the other semiconductor device of said pair, and thus becoming sequentially conductive, said pair of semiconductor devices each having first and second current conducting electrodes and at least one current control electrode, a load circuit connected across the first and second current conducting electrodes of said pair of semiconductor devices via a pair of switch output terminals whereby a load current flows in the load circuit when one or both of said pair of semiconductor devices are in a conductive state, a bias supply circuit connected across said one semiconductor device of said pair of semiconductor devices for connecting a source of bias voltage to the control electrode of said one semiconductor device and rendering it conductive in response to a switch turn-on signal applied to an input terminal and causing a load current of a first value to flow therethrough via respective first and second current conducting electrodes thereof, said first value of load current being used to generate a turn-on voltage signal applied to the control electrode of said other semiconductor device so as to render it conductive and causing a load current of a second value to then flow therethrough the device via respective first and second current conducting electrodes thereof concurrently with the first value of load current through said one semiconductor device.

Further scope of applicability of the present invention will become apparent from the detailed description which follows. It should be noted, however, that the detailed description and the specific examples, while indicating the preferred embodiments of the invention, are provided by way of illustration only, since various changes, modifications, within the spirit and scope of the invention will become apparent to those skilled in the art.

DETAILED DESCRIPTION OF THE DRAWINGS

Figure 2:
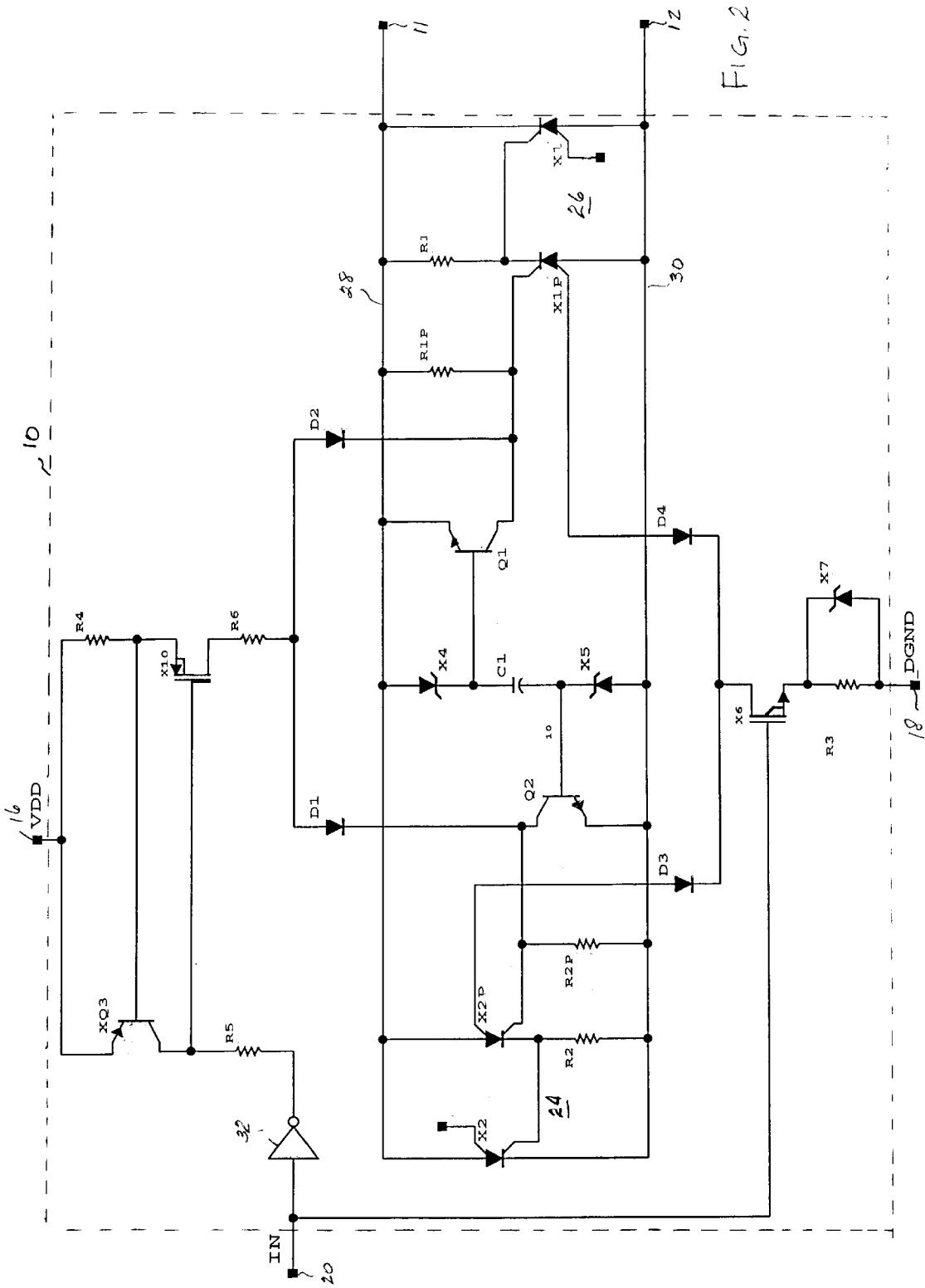

The present invention will become more fully understood when considered in conjunction with the accompanying drawings which are provided only for purposes of illustration, and thus are not meant to be considered in a limiting sense, and wherein:

FIG. 1 is an electrical block diagram illustrative of a ringing switch circuit arrangement in accordance with the subject invention, consisting of two series connected bidirectional ringing access switches; and, FIG. 2 is an electrical schematic diagram illustrative of the preferred embodiment of the two ringing access switches shown in FIG. 1.

DETAILED DESCRIPTION OF THE INVENTION

Referring now to the drawings wherein like reference numerals refer to like parts throughout, reference is first made to FIG. 1 which discloses a pair of identical ringing access switches 10A and 10B which have switch terminals 11A, 12A and 11B, 12B which are connected in series across a ringing signal generator (source) 13 and a telephone ring circuit (ring) 14. The ringing access switches 10A and 10B are each comprised of an integrated circuit having a 500 volt breakdown capability across the respective switch terminals, with terminal 11A of ringing access switch 10A connected to the ring signal generator source 13. Terminal 12A of ringing access switch 10A is directly connected to terminal 11B of ringing access switch 10B whose terminal 12B is connected to the ring circuit 14. The ringing access switches 10A and 10B are powered by a bias voltage source VDD which is connected to terminal 16 and being returned to ground via terminal 18. Respective input terminals 20A and 20B are also provided for receiving a ring signal input commonly applied to input terminal 22.

In operation, when a ring input signal is applied to terminal 22, both ringing access switches 10A and 10B are activated so as to complete a circuit between the ring signal generator source 13 and the ring circuit 14.

Referring now to FIG. 2, disclosed thereat are the details of one of the two ringing access switch circuits shown in FIG. 1. Accordingly, it is designated by reference numeral 10. The primary components of switch circuit 10 are two pairs of controlled rectifiers, more particularly silicon control rectifiers (SCRs), connected in an anti-parallel circuit configuration across terminals 11 and 12 via circuit buses 28 and 30. The first pair of SCRs 24 are comprised of a small pilot SCR X2P and a relatively large current carrying SCR X2 which are coupled in parallel such that their respective anode electrodes are connected to circuit bus 28, while their cathode electrodes are connected to resistor R2 which in turn is connected to circuit bus 30. The second pair of SCRs 26 are likewise comprised of a relatively smaller pilot SCR X1P and a relatively large current carrying SCR X1. Now, however, their respective anodes are connected to circuit bus 30, while their cathodes are connected to resistor R1 which in turn is connected to circuit bus 28.

A portion of the remaining circuitry is used to sequentially turn-on the SCRs in each pair of SCRs 24 and 26, whereby the pilot SCRs X1P and X2P initially become conductive and then operate to turn on the large SCRs X1 and X2. Such an arrangement causes the large SCR X1 and X2 to be less sensitive to turn-on during fast transients. This approach of the pilot SCRs X1P and X2P providing steering currents for rendering the large SCRs X1 and X2 conductive, reduces the bias current required from the ringing source 13 (FIG. 1) by an order of magnitude from the known prior art. Also, it permits a 500 volt switching capability to be provided using 320 volt technology. The remaining circuitry as will be explained subsequently is used to prevent any inadvertent turn-on of the SCRs X1P, X1 and X2P, X2 in response to high voltage transients.

Considering now the turn-on circuitry associated with the SCR pairs 24 and 26, when a binary high logic (positive) voltage appears at input terminal 20, it is commonly applied to the gate electrode of an npn field effect transistor (FET) X6 and the gate electrode of a pnp FET X10 through a signal inverter 32 and resistor R5. A resistor R4 is connected from the source of FET X10 to the VDD supply terminal 16, while the drain electrode is connected to the cathode gates of the pilot SCRs X2P and X1P via a pair of diodes D1 and D2 and resistor R6. A pnp bipolar transistor XQ3 is coupled across FET X10 by having its base and collector connected across the source and gate of FET X10, while its emitter is also connected back to the VDD terminal 16. The purpose of the transistor XQ3 is to operate as a current regulator for the source-drain current of FET X10.

With respect to the other FET X6, it is shown having its source electrode connected to the ground terminal 18 via resistor R3. Resistor R3 is shunted by zener diode X7 which acts as a protection device for the source-drain current of X6. The drain electrode of FET X6 is connected to diodes D3 and D4 which are respectfully connected to the anode gates of pilot SCRs X2P and X1P.

In operation, when the input terminal 20 goes "high", X6 and X10 are biased ON, i.e., become conductive. This operates to set up the bias current for effecting turn-on the pilot SCRs X1P and X2P. Now, when the voltage at terminal 11 is positive with respect to the voltage at terminal 12 and both terminals are operating below ground, bias current flows from VDD terminal 16 through FET X10 and diode D1 to develop a voltage across resistor R2P, which is greater than the turn-on threshold voltage of pilot SCR X2P. This bias current flows out of terminal 12 via circuit bus 30 to the ring circuit 14 (FIG. 1) and represents a current drain on the source 13 via circuit bus 28. As the current through the pilot SCR X2P increases, the voltage across resistor R2 connected from the cathode electrode to circuit bus 28 increases. When it exceeds the threshold for the large SCR X2, SCR X2 turns on. Thereafter, a relatively large load current can flow through SCR X2 without any additional bias current required from the source 13 (FIG. 1).

With terminal 11 more positive than terminal 12, and both terminals are operating above ground, the bias current for the pilot SCR X2P flows from the source 13 through terminal 11, the anode gate of X2P, diode D3 and FET X6 to ground. Once again, this bias current is drained from the source 13. When the voltage across R2 reaches the ON threshold for the large SCR X2, it begins conducting load current.

The circuit shown in FIG. 2 is symmetrical in that the operation for SCRs X1 and X1P is similar to X2 and X2P when the polarity of the voltage across terminals 11 and 12 are reversed. Thus when pilot SCR X1P is turned on via diode D2, the voltage build up across resistor R1 operates to turn-on the large SCR X1 as before.

Considering now the circuitry for preventing transient turn-on, the circuit of FIG. 2 also includes a pair of bipolar transistors Q1 and Q2 as well as a pair of zener diodes X4 and X5 which are interconnected by means of capacitor C1. Transistor Q2 and zener diode X5 become conductive and act as a clamp to short resistor R2P and thus hold the pilot SCR X2P off during fast voltage transient events while transistor Q1 and zener diode X4 operate to become conductive and act as a second clamp to short resistor R1P so as to prevent turn-on of pilot SCR X1P. Such a circuit arrangement prevents inadvertent SCR turn-on for both positive going and negative going transients, for example, transients with slew rates on the order of 2000V/$\mu$ sec. and 300 volts in amplitude.

The pilot SCRs X1P and X2P are designed to be much smaller than larger output SCRs X1 and X2. The smaller physical construction of the pilot SCRs X1P and X2P means that the associate parasitic characteristics of the device, such as junction capacitances, are significantly less compared to the large SCRs X1 and X2 connected in parallel therewith. To clamp the cathode gate to cathode junction of the pilot SCRs X1P and X2P, a large resistance value for R1P and R2P can be used relative to the large SCRs X1 and X2 and still provides sufficient level of immunity to inadvertent turn-on during coupling of fast transient signal. By using a larger resistance for R1P and R2P, less bias current is required to permit conduction through the pilot SCRs X1P and X2P. The bias current for the large SCRs X1 and X2 is the load current through its associated pilot SCR X1P and X2P steered to the resistors R1 and R2 connected between the cathode gate and cathode of the large SCRs. With sufficient current provided through the pilot SCRs, a much smaller resistance value can be used for resistors R1 and R2, causing the larger SCRs X1 and X2 to be less sensitive during turn-on during fast transients. Thus, for example, the pilot SCRs X1P and X2P conduct for ringing currents, for example, below 10nA. When the load current increases above 10mA, the large SCRs X1 and X2 conduct without any additional bias current required from the ringing source 13 (FIG. 1).

When the voltage at input terminal 20 is switched from a logic "high" to a logic "low" state, the switch circuit will continue to conduct via either pair of SCRs 24 or 26 staying turned on until the load current drops below the hold current of the pilot SCR X1P or X2P. The hold current is determined by the value of resistor R1P and resistor R2P and can be set below 1mA, which allows the SCRs to inherently turn-off near zero current without additional sensing circuitry being required. This load current turn-off feature provides switching of high voltage signals into inductive loads with minimal voltage transients or impulse noise.

Accordingly, what has been shown and described is an improved solid state switch which operates as a ringing access switch requiring low operating power while providing improved dV/dt sensitivity and preventing low impulse noise from triggering low current turn off. Also, a significant cost reduction is achieved by savings in the required area on the chip or die when the switch is implemented as an integrated circuit.

Having thus shown and described what is at present considered to be the preferred embodiment of the invention, it should be noted that the same has been made by way of illustration and not limitation. Accordingly, all modifications, alterations, and changes coming within the scope of the invention as set forth in the appended claims are herein meant to be included.

What is claimed is:

1. A solid state switch circuit which can be implemented in an integrated circuit, comprising:

at least one pair of parallel semiconductor devices comprised of controlled rectifiers connected together such that the conductive state of one of the controlled rectifiers of said pair controls the conductive state of the other controlled rectifier of said pair, and thus becoming sequentially conductive, said pair of controlled rectifiers each having anode and cathode current conducting electrodes and at least one current control gate electrode, wherein said one controlled rectifier comprises a relatively low load current carrying pilot controlled rectifier and said other controlled rectifier comprises a relatively large load current carrying controlled rectifier, a load circuit connected across the anode and cathode electrodes of said pair of controlled rectifiers via a pair of output terminals whereby a load current flows in the load circuit when one or both of said pair of controlled rectifiers are in a conductive state, a bias supply circuit connected to the pilot controlled rectifier so as to connect a bias voltage to the gate electrode thereof, rendering it conductive in response to a switch turn-on signal applied to an input terminal and causing a first load current of a first value to flow therethrough via respective anode and cathode electrodes thereof, said first load current being used to generate a turn-on voltage signal applied to the gate electrode of said other controlled rectifier so as to render it conductive and causing a second load current of a second value greater than said first value of load current to then flow therethrough via respective anode and cathode electrodes thereof concurrently with the first load current through said pilot controlled rectifier.

2. A solid state switch according to claim 1 and additionally including an electrical impedance connected in series with the cathode electrode of the pilot controlled rectifier for generating a voltage thereacross which is applied to the gate electrode of the relatively large load current carrying controlled rectifier for rendering it conductive.

3. A solid state switch according to claim 1 wherein said bias supply circuit includes a semiconductor device having first and second current conducting electrodes and a control electrode, said first and second current conducting electrodes being connected between said source of bias voltage and said gate electrode of said one controlled rectifier and said control electrode being connected to said input terminal.

4. A solid state switch according to claim 3 wherein said semiconductor device of said bias supply circuit comprises a transistor.

5. A solid state switch according to claim 3 wherein said one controlled rectifier includes a second gate electrode and wherein said bias supply circuit includes another semiconductor device also having first and second current conducting electrodes and a control electrode, said first and second current conducting electrodes being connected between a source of reference potential and said second gate electrode of said one controlled rectifier, and said control electrode being connected to said input terminal.

6. A solid state switch according to claim 5 wherein both said semiconductor devices of said bias supply circuit are comprised of transistors.

7. A solid state switch according to claim 6 wherein said transistors are comprised of mutually opposite semiconductivity type transistors.

8. A solid state switch according to claim 1 and additionally including a circuit connected to one of said pair of controlled rectifiers for preventing inadvertent turn-on of said pair of controlled rectifiers in response to transient signals.

9. A solid state switch according to claim 8 wherein said circuit for preventing inadvertent turn-on is connected to the electrode of said one controlled rectifier.

10. A solid state switch according to claim 1 wherein said at least one pair of controlled rectifiers comprise two pairs of parallely connected controlled rectifiers symmetrically coupled in a mutually opposite polarity sense to the load circuit, whereby one pair of controlled rectifiers become sequentially conductive for a first polarity of voltage across said output terminals and the other pair of controlled rectifiers become sequentially conductive for a second polarity of voltage across said output terminals.

11. A solid state switch adapted for telecommunications switching applications and residing in an integrated circuit, comprising:

two pairs of parallel semiconductor devices comprised of controlled rectifiers connected in mutually opposite polarity sense across a pair of output terminals, one pair of controlled rectifiers of said two pairs of controlled rectifiers becoming conductive for a first polarity of voltage across said output terminals, and the other pair of controlled rectifiers of said two pairs of controlled rectifiers becoming conductive for a second polarity of voltage across said switch output terminals, each said pair of controlled rectifiers including first and second controlled rectifiers connected together in parallel such that the conductive state of the first controlled rectifier of each said pair of controlled rectifiers controls the conductive state of the second controlled rectifier of said pair of controlled rectifiers and thereby becoming sequentially conductive, wherein the first controlled rectifier of each said pair comprises a relatively low load current carrying pilot controlled rectifier and the second controlled rectifier comprises a relatively large load current carrying controlled rectifier, a load circuit connected to said pair of output terminals whereby a load current flows in the load circuit when said first controlled rectifier of one pair of said controlled rectifiers initially becomes conductive followed by said second controlled rectifier of said pair of controlled rectifiers conductive state, a bias supply circuit connected to the pilot controlled rectifier of both pairs of controlled rectifiers for connecting a source of bias voltage to a gate control electrode thereof and depending upon the polarity of voltage across said output terminals, rendering the first controlled rectifier of one of said pairs of controlled rectifiers conductive in response to a switch turn-on signal applied to an input terminal and causing a first load current of a first value to flow therethrough, said first load current being used to generate a turn-on voltage signal applied to a gate control electrode of the second controlled rectifier of said one pair of controlled rectifiers sequentially rendering it conductive and causing a second load current of a second value greater than said first value of load current of the pilot controlled rectifier to then flow through the second controlled rectifier thereof concurrently with the first load current in the pilot controlled rectifier.

12. A solid state switch according to claim 11 and additionally including an electrical impedance connected in series with the pilot controlled rectifier for generating the turn-on voltage signal for the relatively large current carrying controlled rectifier.

13. A solid state switch according to claim 11 wherein said controlled rectifiers include anode and cathode electrodes and a gate control electrode and wherein said bias supply circuit includes a semiconductor device also having first and second current conducting electrodes and a control electrode, said first and second current conducting electrodes being connected between said source of bias voltage and the gate control electrode of the pilot controlled rectifier of each said pair of semiconductor devices and wherein the gate control electrode is connected to said input terminal.

14. A solid state switch according to claim 13 wherein said semiconductor device of said bias supply circuit comprises a transistor.

15. A solid state switch according to claim 14 wherein the first controlled rectifier of said pair includes a second current control electrode and wherein said bias supply circuit includes another transistor also having first and second current conducting electrodes and a control electrode, said first and second current conducting electrodes being connected between a source of reference potential and said second current control electrode of said one controlled rectifier, and said control electrode of said another transistor also being connected to said input terminal.

16. A solid state switch according to claim 15 wherein said transistors of said bias supply circuit are comprised of mutually opposite semiconductivity type transistors.

17. A solid state switch according to claim 11 and additionally including a circuit connected to both pairs of controlled rectifiers for preventing inadvertent turn-on of said semiconductor devices in response to transient signals.

18. A solid state switch according to claim 17 wherein said circuit for preventing inadvertent turn-on is connected to a gate control electrode of said first controlled rectifier of both said pairs of controlled rectifiers.

* * * * *